United States Patent [19]

Wolpert et al.

[11] 4,180,599
[45] Dec. 25, 1979

[54] CROSSLINKING PHOTOINITIATORS OF ACRYLIC BENZOPHENONETETRACARBOXYLATES

[75] Inventors: Stephen M. Wolpert, Detroit; Gustav J. Nerath, Canton, both of Mich.

[73] Assignee: The United States of America as represented by the Secretary of the Army, Washington, D.C.

[21] Appl. No.: 937,681

[22] Filed: Aug. 25, 1978

[51] Int. Cl.$^2$ .............................................. B05D 3/06
[52] U.S. Cl. ............................... 427/54.1; 204/159.22
[58] Field of Search ...................... 427/54; 204/159.22

[56] References Cited

U.S. PATENT DOCUMENTS

| | | | |
|---|---|---|---|
| 3,725,116 | 4/1973 | Parker et al. | 427/54 |
| 4,004,998 | 1/1977 | Rosen | 427/54 |

*Primary Examiner*—John H. Newsome
*Attorney, Agent, or Firm*—Peter A. Taucher; John E. McRae; Nathan Edelberg

[57] ABSTRACT

A method of forming an acrylic polymer coating on a substrate wherein the coating is cured with ultraviolet light. Photoinitiation of the crosslink reaction is provided by a benzophenone moiety in the crosslinking agent. The photoinitiator moiety is an integral part of the chain, thereby producing a relatively fast cure rate while contributing strength and coherence to the network.

1 Claim, No Drawings

CROSSLINKING PHOTOINITIATORS OF ACRYLIC BENZOPHENONETETRACARBOXYLATES

BACKGROUND AND SUMMARY OF THE INVENTION

This invention relates to acrylic organic coating monomers curable with ultraviolet light to polymerize into relatively hard and tough organic coatings.

Prior art coatings of this general type utilize as crosslinking agents acrylic or other unsaturated monomers, together with separate photoinitiators, for producing free radicals after ultraviolet radiation. Such free radicals produce the necessary polymerization and crosslinking. Among the known acrylic type monomers used in the art are the following: Tetrahydrofurfuryl acrylate; Ethylene glycol phthalate acrylate; Dimethylaminoethyl acrylate; Ethylhexyl acrylate; Hydroxyethyl acrylate; N-vinyl-pyrrolidone; Hydroxpropyl acrylate; and some well known photoinitiators include the following: Benzoin alkyl ethers; 4,4'-bis(diethylamino)benzophenone; Acetone and other ketones; Benzophenone; and Thioxanthenone. Some well known crosslinking agents, which may be resinous or non-resinous, include the following: Polyesters of maleic anhydride; Acrylic terminated polyurethanes; Trimethylolpropane triacrylate; Pentaerythritol triacrylate; Hexanediol diacrylate; and Neopentyl glycol dimethacrylate. Since these crosslinking acrylic materials may be too viscous for convenient application, monomers are added as reactive diluents to lower the viscosity of the coating formulation.

In the prior art known to us the two necessary steps of photoinitiation and crosslinking are accomplished by at least two separate compounds of the types described above. The present invention seeks to provide both the photoinitiator and the crosslinking agent in one molecule. Formulations using this invention are believed to be simpler than prior art formulations. Another advantage of the new formulation is a faster cure rate.

As a possible explanation for the faster cure rate we consider the fate of a photoinitiator molecule after it has been activated by ultraviolet light, formed one or more free radicals, and has initiated polymerization. When the photoinitiator is a separate compound, as in the known prior art, the photoinitiator becomes an inactive tail on the polymerizing chain. The tail end of the chain containing the photoinitiator residue dangles freely without contributing to the crosslinking and therefore without contributing to the strength or coherence of the network. However with our invention, the photoinitiator (or fragment) at the chain end still contains at least one acrylic moiety which can continue the polymerization or crosslinking reaction and therefore can develop a strong coherent polymer network sooner.

The invention concerns a method of forming a polymeric coating on a substrate by irradiating a monomer coating material with ultraviolet light. The monomer coating may include as the sole reactive crosslinking agent an acrylic benzophenonetetracarboxylate having the following general formula:

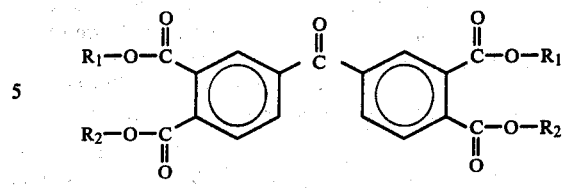

In the above general formula $R_1$ are acrylic residues from alcohols such as 2-hydroxyethyl acrylate, and $R_2$ are acrylic residues from epoxies, such as 2,3-epoxypropyl acrylate.

The above compound, on exposure to ultraviolet light, produces free radicals, which then initiate polymerization in surface coatings and inks.

The photoinitiator-crosslinking molecule of our invention (generalized structure shown above) is prepared in two steps. Starting with 3,3',4,4'-Benzophenonetetracarboxylic Acid Dianhydride (BTDA), we first alcoholize one mole of BTDA with two moles of unsaturated alcohol(s). The result is an intermediate di-ester/di-acid, shown below.

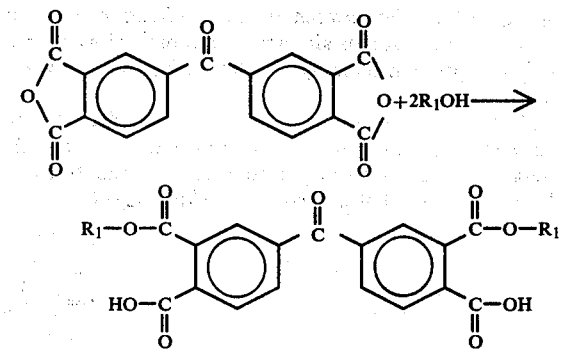

Second, we react the two remaining acid groups on the intermediate compound with two moles of epoxy(s), to form β-hydroxyester linkages. The result is the previously described tetra-ester of BTA (acrylic benzophenonetetracarboxylate).

The manufacturing conditions for these two steps must also inhibit the free-radical reaction of the unsaturated compounds using appropriate inhibitors. The acid-epoxy reaction may be catalyzed for faster rates. Progress of the reactions may be conveniently followed by determining its acid number; dioxane is one useful solvent for this purpose.

The reaction between BTDA and the alcohol(s) preferably should be completed before adding any epoxy. The reaction between BTDA and alcohols occurs slowly at room temperatures and should be accelerated by higher temperatures and by suitable well-known catalysts. Generally, temperatures above 40° C. are required to dissolve the components and to complete the alcoholisis reaction within a few hours.

Between 0% and 80% by weight of BTDA of an inert polar solvent (such as N-methyl-2-pyrrolidone, dimethylacetamide, dimethylformamide, and the like) is helpful in dissolving the components and does not interfere with subsequent reactions or with curing by ultraviolet light. Usually the solvent need not be removed from the final product.

Since anhydrides are well known as curing agents for epoxies, the epoxy compound need not necessarily be added after the alcohol has completely reacted with BTDA: the epoxy may also be added before or simultaneously with the alcohol, but then one must provide for the side-reaction between the alcohol and the epoxy.

The acid-epoxy reaction occurs slowly at room temperature but may be accelerated by higher temperatures or by suitable well-known catalysts such as tertiary amines, acids, bases, etc. Tertiary amines seem especially useful because they (1) selectively catalyze the reaction of the epoxide with acids in preference to alcohols and (2) because they may be co-catalysts with benzophenone-type photoinitiators.

The choice and concentration of inhibitor is not generally critical. Hydroquinone and p-methoxyphenol (also called hydroquinone methyl ether) are useful inhibitors at concentrations between 0.01% and 0.7% by weight of acrylic monomers. Their effectiveness is increased by oxygen or air. Air should preferably be pre-dried to prevent hydrolysis of the anhydride by water vapor.

The invention will be more readily understood by reference to the following examples which describe the detailed preparation of representative products useful both as photoinitiators and crosslinking agents.

This product was an amber-colored, sticky, viscous resin which was found to be effective as a dual-purpose photoinitiator and crosslinking agent in uv-curable coatings.

The main product produced by this Example has the following chemical structure.

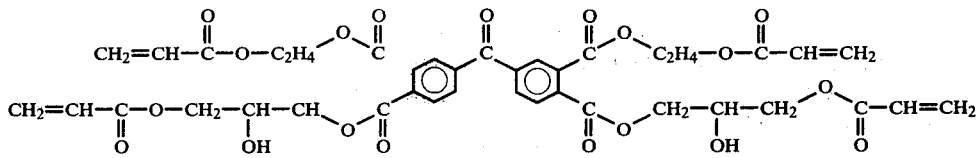

Smaller amounts of the oligomers of epoxypropyl acrylate would also result from ionic polymerization through epoxy groups.

EXAMPLE 2

Into a suitable vessel equipped with means for stirring and temperature control was mixed: 0.10 mole BTDA (32.2 grams) and 0.23 moles 2-hydroxyethyl methacrylate, (30.5 grams, prestabilized with 0.12% p-methoxyphenol, 15% molar excess over stoichiometric ratio). The reactants were warmed for about two hours to temperatures between 90° and 140° C. On cooling to room temperature, the product was a very viscous (almost glassy) brown resin. This resin was soluble in tetrahydrofuran, dimethylformamide, acrylic monomers, aromatic solvents, and aqueous ammonia but insoluble in water. The main product is the di-ester/di-acid shown below:

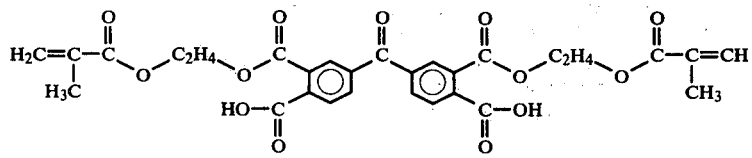

EXAMPLE 1

Into a vessel equipped with thermometer, stirring paddle, air purge inlet and outlet, and heater, was placed 0.10 mole BTDA (32.2 grams); 0.21 mole hydroxyethylacrylate (24.4 grams); Dimethyl Acetamide (inert solvent, 8.1 grams), and p-Methoxypenol (0.18 grams, free radical stabilizer). The contents were stirred, flushed with dried air to inhibit free radical side reactions, and warmed for about 90 minutes until the temperature reached 75° C. By then, the mixture had dissolved into a clear, light brown solution and the alcoholisis of the anhydride was complete. Then 0.21 moles 2,3-Epoxypropyl Acrylate (27 grams) were added and the temperature maintained between 45° and 60° C. for about six hours. The product was allowed to cool overnight. Then an additional 0.1 mole epoxypropyl acrylate 12.8 grams, and 0.5 grams triamylamine (3°-amine catalyst for acid-epoxy reaction) were added; the solution was maintained between 40° and 50° C. as before for another six hours and allowed to cool overnight. The acid number, determined in dioxane with alcoholic KOH, was 34 corresponding to about 90% conversion. After several days sitting at ambient temperature, the acid number decreased to 10.4 corresponding to 97% of the theoretical conversion of carboxylic acid to ester groups.

EXAMPLE 3

An oligomeric photoactive, crosslinking resin was prepared by mixing:

| | | |
|---|---|---|
| BTDA | 0.30 moles | 97.2 grams |
| 2-Hydroxyethyl Acrylate | 0.33 moles | 38.5 grams |
| 1,4-Butane Diol (anhydrous) | 0.31 eqv. | 13.9 grams |
| Dimethyl Acetamide | Optional solvent | 28.0 grams |
| p-Methoxyphenol | Inhibitor | 0.04 grams |

The above components were flushed with dry air while heated between 75° and 100° C. for 5½ hours. By then about 90% of the anhydride groups had been esterified. Product was an amber colored resin, glassy at 25° C., and soluble in common organic solvents and monomers. The resin contains both ester and carboxylic acid groups. Its chemical structure is primarily the following:

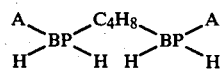

where BP is

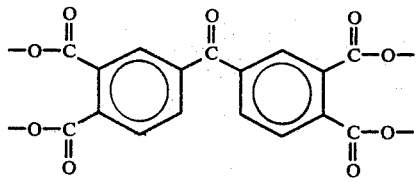

and A is

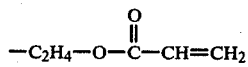

and H (when attached to BP) represents the carboxylic acid group.

The resins in Examples 2 and 3 are by themselves useful as dual purpose photoinitiators and crosslinking agents. Alternately, they may be considered as intermediates for further reaction with epoxy compounds as described in the next two examples.

EXAMPLE 4

To 49.4 grams (0.28 moles) of the resinous product produced in Example 3, were added 64.3 grams (0.50 moles) 2,3-Epoxypropyl acrylate (also called glycidyl acrylate) plus another 0.04 grams p-methoxyphenol. While flushing with dry air, the components were stirred and heated to 75° where they dissolved. The viscous solution was maintained between 75° C. and 100° C. for almost one hour and then cooled. About 83% of the total anhydride plus acid had been esterified. The brownish product was a soft elastomer soluble in common organic solvents. Its average chemical composition is represented below:

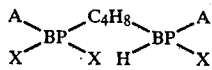

where BP, A and H were as defined above and X is

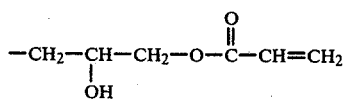

Other isomers and structures will also be present.

EXAMPLE 5

Into an open vessel equipped with means for stirring and temperature control, was placed 20.0 grams of the half-ester resin produced in Example 3 (these 20.0 grams contained about 0.072 equivalents of total free acid and alcohol). To this resin was added 11.2 grams Butyl Glycidyl Ether (commercial designation Heloxy-61 of Wilmington Chemical Corporation), 10.0 grams Acetone (solvent and temperature regulator), and 0.02 grams p-Methoxyphenol. The temperature was brought to 65° C. where the components dissolved. Temperature was maintained between 65° C. and 80° C. for 135 minutes, after which the esterification of the acids were about 75% complete. The product was an amber-colored viscous syrup, soluble in common organic solvents, monomers and reactive diluents; it was found useful as a crosslinking photoinitiator when formulated into a coating. The main product has the following average molecular structure.

where B is

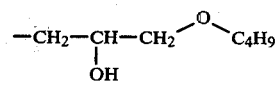

and BP, A and H have their previous meanings.

Products produced by Examples 1 through 5 were incorporated into coatings for subsequent application as thin films on metal or treated paper substrates. After application to the substrates the coatings were cured by irradiation with ultra-violet light, using a Canrad-Hanovia Laboratory Model 45080 Ultraviolet Lamp System. This lamp system uses a medium pressure mercury lamp having a strong output around 365.0 and 366.3 nanometers; it has a weaker output at 334.1, 313.0 and 302.5 nanometers. Curing speeds were usually noted as the number of passes of the specimen under the lamp at a speed of thirty five or seventy feet per minute. For this Hanovia system one pass at seventy feet per minute corresponds to an exposure time of 0.07 seconds.

A coating was considered to be cured when it had assumed a dry hard condition on the substrate. Two tests used as a criterion for completeness of cure were: the coating withstood rupture or tearing when written upon by a Number 2 pencil, and the coating could be rubbed with a rag soaked in methyl ethyl ketone without smearing.

A series of experiments demonstrated the effectiveness of this invention as a dual-purpose photoinitiator and crosslinking agent. The product of Example 1 was blended with tetrahydrofurfuryl acrylate (hereinafter referred to as THFA) obtained from Daubert Chemical Corporation under its designation "Melcrill 4079." The Example product was incorporated into the THFA as an additive in a minor percentage for the purpose of photoinitiating and crosslinking the THFA system. The concentration of the Example 1 product additive in the THFA (expressed as % meaning grams of the additive product per 100 grams of THFA) was varied between 1% and 22%. The coating material was applied to substrates at a thickness of 5 mils (0.005 inch), after which the samples were passed under the ultraviolet lamp at a speed of seventy feet per minute. Cure times were as shown in Table 1 set forth herebelow. For comparison purposes other tests were run with a coating blend of THFA and benzoin methyl ether, which is a photoinitiator commonly used in the art. Further tests were run with a coating consisting of THFA and an additive comprised of two parts by weight benzophenone (a well known photoinitiator) and one part by weight trimethylolpropane triacrylate (a well known crosslinking agent). Cure times for these comparison coatings are also shown in Table 1. In the table the abbreviation TMPTA is used to designate trimethylolpropane triacrylate.

TABLE 1

Cure Rates for Tetrahydrofurfuryl Acrylate
with Three Curing Agents (Additives)

| ADDITIVE | ADDITIVE % CONCENTRATION | PASSES TO CURE |
|---|---|---|
| Example 1 product | 1.0 | 20 |
| | 1.5 | 10 |
| | 2.0 | 8 |
| | 4 | 4 |
| | 6 | 3 |
| | 13 | 3 |
| | 22 | 3 |
| Benzoin methyl ether | 2 | 20 |
| | 5 | 18 |
| | 12 | 16 |
| Benzophenone + TMPTA | 3 | 9 |
| | 5 | 6 |

These tests indicate that with equal weight concentrations of various additives, coatings using the Example 1 product cure much faster than coatings using the prior art photoinitiators and crosslinking agents. This significant improvement is believed to be due to the fact that the Example 1 product serves both as a photoinitiator and as a crosslinking agent. The product is devoid of the inactive dangling chain ends that characterize the prior art photoinitiators.

This invention is also useful for coatings which are extended, filled or pigmented. Four parts by weight of Example 1 product was mixed with 100 parts THFA and 50 parts amorphous silica filler/extender (Imsil A-25, Illinois Minerals Co.). This coating cured quickly and completely to an amber colored, coherent film. The cure time, 4 passes at 70 feet/minute for a 2.5 mil dry coating thickness, was the same with or without the silica filler.

With reference to usefulness of the Example 2 product, one hundred parts by weight each of the Example 2 product, THFA, and silica filler (Imsil A-25) were milled for several hours in a ball mill. Also about 0.5 parts of silicone additive Dow Corning No. 14 was added to improve leveling and flow properties. For reference purpose this formulation will be called "Formulation 4". Films of Formulation 4 were cast with a doctor blade set to a 7 mil gap and irradiated at a line speed of 35 feet/minute. The coating completely cured to a hard tough film in two passes. It will be obvious that much higher line speeds could be used for thinner films.

One hundred parts of Formulation 4 was blended with 20 parts pentaerithriol triacrylate and coated on a substrate to a wet film thickness of 7 mils. This blend cured to a hard tough film after one pass at thirty five feet per minute.

One hundred parts of Formulation 4 was blended with 70 parts of pentaerithriol triacrylate and applied as above. This blend cured to a very hard, brittle film after one pass at 35 feet per minute.

One hundred parts by volume of Formulation 4 were blended with 50 parts by volume of Styrene monomer and tested as a 7 mil coating. The blend cured slowly to a soft, wrinkled film after 5 passes at 35 feet minute.

One hundred parts by volume of Formulation 4 was blended with 50 parts of 1,6-Hexanediol Diacrylate and tested as a 7 mil coating. The blend cured to a tough, smooth film after two passes at 35 feet per minute.

A formulation of 100 parts by weight of the Example 3 product, 265 parts THFA, 5 parts fumed silica thixotropic additive (Cab-O-Sil M-5, Cabot Corporation), cured to a tough, pale yellow, glossy, 3 mil thick film, after 2 passes at 70 feet/minute. This formulation will for convenience be referred to as "Formulation 5".

To one hundred parts of Formulation 5 was blended 100 parts by weight Silica filler/extender (Imsil a-10); test results with a 3 mil thick film were the same as noted above except the cured film was flat instead of glossy.

With reference to the usefulness of the product produced by Example 5, one hundred parts of the Example 5 product were blended with 41 parts THFA, 15 parts silica extender (Imsil A-15), and 1 part flow control agent (Modaflo from Monsanto Corporation). This formulation will be here termed "Formulation 6".

Formulation 6, four mils wet thickness, transformed after 1 pass at 70 feet/minute to a soft weak film. Even after five passes of the lamp the coating was not hard enough to be written upon with a Number 2 pencil without disturbing the coating.

To 100 parts of Formulation 6 was blended 11 parts Neopentyl Glycol Diacrylate (abbreviation NPGDA) which is a well known crosslinking agent. This formulation four mils thick cured quickly and completely after 2 passes at 70 feet/minute. One could write on the film with a Number 2 pencil. The same results were obtained when an additional 17 parts of NPGDA was incorporated in the blend.

To 100 parts of the last mentioned formulation was added an additional 7 parts of "Vicure—10 Photosensitizer" (Stauffer Chemical Company) which is an effective photoinitiator of the benzoin alkyl ether type. This excess photoinitiator did not increase the cure speed or coating toughness.

These test results with Formulation 6 indicate that the product of Example 5 by itself is useful as the sole photoinitiator in various monomer formulations. However, it appears that best results are obtained when the Example 5 product is used with other crosslinking agents. This is because (unlike Example 4) Example 5 was reacted with a non-functional epoxy, butyl glycidyl ether, which contributes nothing to the crosslinking capability of the molecule.

This invention concerns primarily the photoinitiator-crosslinking resin (Examples 1 through 5) having the generalized molecular structure of an acrylic benzophenonetetracarboxylate. The benzophenone moiety within this molecule is believed to provide the photoinitiator action which eventually enables the acrylic radicals to become effective as cross linkages for the principal acrylate monomer.

In making the acrylic benzophenonetetracarboxylate an unsaturated alcohol is reacted with the acid dianhydride to form an intermediate compound; an epoxy is then caused to react with the remaining acid groups in the intermediate compound. It is believed that various unsaturated alcohols of the acrylic type can be used; acrylic type here refers to ester and amide derivatives of acrylic acid, methacrylic acid, crotonic acid, itaconic acid, fumaric acid, maleic acid and the like. Furthermore saturated alcohols and diols may be used. The epoxy used in the process may, for example, be a glycidyl ester of an unsaturated acid such as 2,3-epoxypropyl acrylate or methacrylate, or epoxidized drying oils, or epoxidized olefins, or various glycidyl ethers both saturated and unsaturated. It is obvious that saturated alcohols and epoxy compounds do not contribute to crosslinking capability.

The invention described herein may be manufactured, used, and licensed by or for the Government for governmental purposes without payment to us of any royalty thereon.

We wish it to be understood that we do not desire to be limited to the exact details of construction shown and described for obvious modifications will occur to a person skilled in the art.

We claim:

1. A method of forming an acrylic polymeric coating on a substrate comprising the steps of (1) formulating an acrylic monomer coating material to include as the sole reactive crosslinking ingredient and as the sole photosensitizing catalyst, an acrylic benzophonenetetracarboxylate derivative, (2) forming a film of said coating material on the substrate, and (3) subjecting said film to ultraviolet light so that the acrylic moieties in said carboxylate derivative are permitted to form network cross linkages after catalytic initiation by the benzophenone moiety; the acrylic benzophenonetetracarboxylate derivative having the formula:

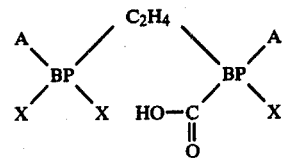

where BP is

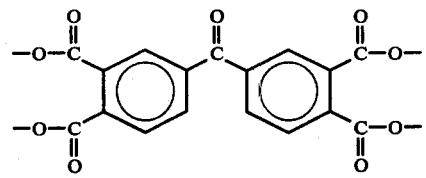

and A is

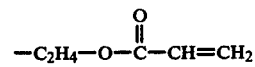

and X is

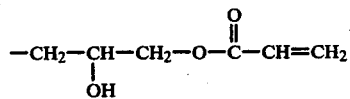

* * * * *